US012681056B2

(12) United States Patent
Chhabra et al.

(10) Patent No.: US 12,681,056 B2
(45) Date of Patent: Jul. 14, 2026

(54) VOLTAGE DROOP DETECTION

(71) Applicant: Arm Limited, Cambridge (GB)

(72) Inventors: Amit Chhabra, Noida (IN); Rainer Herberholz, Great Abington (GB); Anuj Grover, South Delhi (IN)

(73) Assignee: Arm Limited, Cambridge (GB)

( * ) Notice: Subject to any disclaimer, the term of this patent is extended or adjusted under 35 U.S.C. 154(b) by 91 days.

(21) Appl. No.: 18/925,346

(22) Filed: Oct. 24, 2024

(65) Prior Publication Data

US 2025/0138059 A1    May 1, 2025

(51) Int. Cl.
| | |
|---|---|
| *G01R 19/165* | (2006.01) |
| *G06F 1/30* | (2006.01) |
| *H03K 5/14* | (2014.01) |
| *H03K 5/00* | (2006.01) |

(52) U.S. Cl.
CPC ......... *G01R 19/16576* (2013.01); *G06F 1/30* (2013.01); *H03K 5/14* (2013.01); *H03K 2005/00019* (2013.01)

(58) Field of Classification Search
CPC ....... G01R 19/16576; G06F 1/30; G06F 1/08; G06F 1/28; G06F 1/305; H03K 5/14; H03K 2005/00019
USPC ........................................................ 327/291
See application file for complete search history.

(56) References Cited

U.S. PATENT DOCUMENTS

| | | | | | |
|---|---|---|---|---|---|
| 11,493,980 | B1 * | 11/2022 | Dibbad | .................... | G06F 1/324 |
| 2011/0241423 | A1 * | 10/2011 | Bridges | .................. | G06F 1/305 |
| | | | | | 307/31 |

| | | | | | |
|---|---|---|---|---|---|
| 2013/0318364 | A1 * | 11/2013 | Berry, Jr. | ............ | G06F 11/3062 |
| | | | | | 713/300 |
| 2017/0214399 | A1 * | 7/2017 | Zogopoulos | .......... | G06F 1/3206 |
| 2020/0089299 | A1 * | 3/2020 | Kim | ...................... | H03L 7/0997 |
| 2021/0313989 | A1 * | 10/2021 | Liu | ........................ | G06F 21/81 |
| 2023/0198528 | A1 * | 6/2023 | Mazumdar | .............. | G06F 1/324 |
| | | | | | 326/99 |
| 2024/0106438 | A1 * | 3/2024 | Mazumdar | ....... | G01R 19/16552 |
| 2025/0052812 | A1 * | 2/2025 | Aneja | ..................... | G06F 1/324 |
| 2025/0138059 | A1 * | 5/2025 | Chhabra | ................... | G06F 1/28 |

OTHER PUBLICATIONS

Combined Search and Examination Reported under Sections 17 and 18(3) for GB Application No. 2403974.5 dated Dec. 19, 2024.

* cited by examiner

*Primary Examiner* — Ryan Jager
(74) *Attorney, Agent, or Firm* — DeWitt LLP

(57) ABSTRACT

The present techniques relate to voltage droop detection and there is disclosed circuitry for detecting a voltage droop event, the circuitry configured to: receive a clock signal from a clock distribution network; obtain, from a storage, a first predetermined value, a second predetermined value and a predetermined threshold count; obtain one or more measurement values associated with a system voltage; when a first measurement value of the one or more measurement values reaches the first predetermined value, initiate a count of clock cycles until a subsequent measurement value of the one or more measurement values reaches the second predetermined value, the second predetermined value being different from the first predetermined value; and when the count of clock cycles is lower than the predetermined threshold count, cause a control entity to take mitigation action.

20 Claims, 8 Drawing Sheets

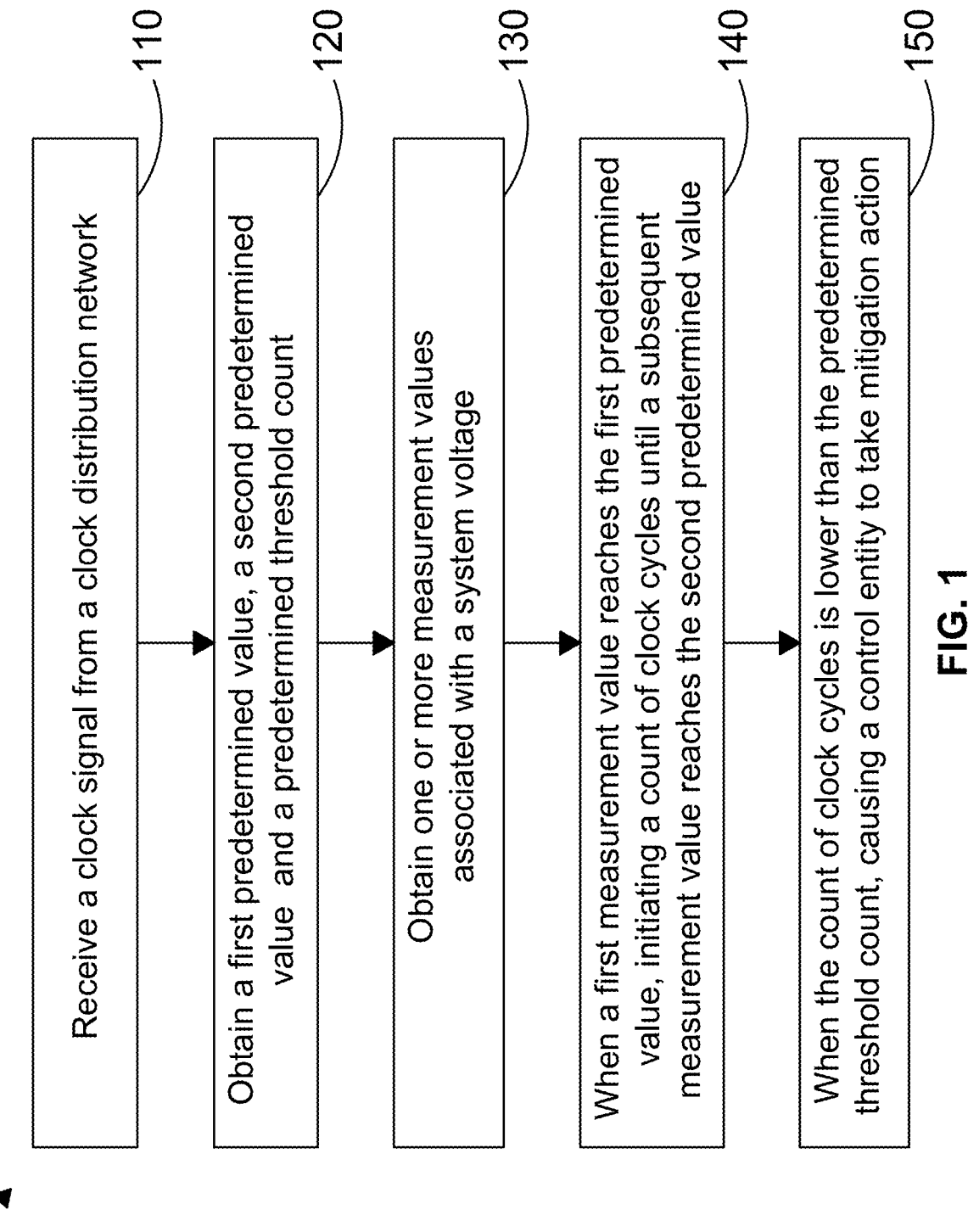

Receive a clock signal from a clock distribution network
110

Obtain a first predetermined value, a second predetermined value and a predetermined threshold count
120

Obtain one or more measurement values associated with a system voltage
130

When a first measurement value reaches the first predetermined value, initiating a count of clock cycles until a subsequent measurement value reaches the second predetermined value
140

When the count of clock cycles is lower than the predetermined threshold count, causing a control entity to take mitigation action
150

VOLTAGE DROOP DETECTION

TECHNICAL FIELD

The present techniques relate to droop detection. In particular, the present techniques relate to detection of voltage droop events in processing circuitry (such as a CPU or GPU).

BACKGROUND OF THE DISCLOSURE

Some computer circuits (e.g. a central processor unit (CPU) or graphics processor unit (GPU)) may experience performance issues. For example, a CPU can generate voltage droops due to large changes in current required from a power delivery network (PDN).

There is a need for mitigation action to address such performance issues.

SUMMARY OF THE DISCLOSURE

The present techniques relate to addressing or mitigating such performance issues, or improving known mitigation techniques.

According to a first aspect of the present techniques, there is provided circuitry for detecting a voltage droop event, the circuitry being configured to: receive a clock signal from a clock distribution network; obtain, from a storage, a first predetermined value, a second predetermined value and a predetermined threshold count; obtain one or more measurement value associated with a system voltage; when a first measurement value of the one or more measurement values reaches the first predetermined value, initiate a count of clock cycles until a subsequent measurement value of the one or more measurement values reaches the second predetermined value, the second predetermined value being different from the first predetermined value; and, when the count of clock cycles is lower than a predetermined threshold count, cause a control entity to take mitigation action.

The measurement value may be positively correlated with the system voltage, the measurement value reaching the first predetermined value when the measurement value is less than or equal to the first predetermined value. The measurement value may comprise a score, the score corresponding to a count of a number of fine gate stages traversed in a delay line during a predetermined number of clock cycles. The predetermined number of clock cycles may be one clock cycle. The count may correspond to the slope of the droop event.

The mitigation action may comprise causing the clock distribution network to decrease a frequency of the clock signal. The mitigation action may be selected from a plurality of actions based on the count.

The circuitry may be further configured to: obtain, from the storage, a third predetermined value; provide a droop detection signal to the clock distribution network in response to the measurement value reaching the third predetermined value, the third predetermined value being different from the second predetermined value; and cause the control entity to take a second mitigation action in response to the droop detection signal.

The second mitigation action may comprise pausing the clock, and wherein the second mitigation action may comprise pausing the clock for a predetermined number of clock cycles before restarting the clock.

The storage may comprise at least one register. The storage may be a non-volatile storage medium.

The circuitry may be configured to implement a state machine.

The circuitry may be configured to: when a subsequent measurement value of the one or more measurement values reaches the first predetermined value after having caused the control entity to take mitigation action, reset a register storing the count of clock cycles.

According to a further aspect, there is provided a method comprising: receiving a clock signal from a clock distribution network; obtaining, from a storage, a first predetermined value, a second predetermined value and a predetermined threshold count; obtaining one or more measurement values associated with a system voltage; when a first measurement value of the one or more measurement values reaches the first predetermined value, initiating a count of clock cycles until a subsequent measurement value of the one or more measurement values reaches the second predetermined value, the second predetermined value being different from the first predetermined value; and, when the count of clock cycles is lower than a predetermined threshold count, causing a control entity to take mitigation action.

The measurement value may be positively correlated with the system voltage, the measurement value reaching the first predetermined value when the measurement value is less than or equal to the first predetermined value.

The measurement value may comprise a score, where the score may correspond to a count of a number of fine gate stages traversed in a delay line during a predetermined number of clock cycles. The predetermined number of clock cycles may be one clock cycle. The count may correspond to the slope of the droop event.

The mitigation action may comprise causing the clock distribution network to decrease a frequency of the clock signal. The mitigation action may be selected from a plurality of actions based on the count.

According to yet another aspect, there is provided an apparatus comprising: circuitry for detecting a voltage droop event; a power delivery network configured to provide power to the circuitry at a system voltage; and a clock distribution network configured to provide a clock signal to the circuitry; and wherein the circuitry is configured to: obtain, from a storage, a first predetermined value, a second predetermined value and a predetermined threshold count; obtain one or more measurement value associated with a voltage provided by the power delivery network; when a first measurement value of the one or more measurement values reaches the first predetermined value, initiate a count of clock cycles until a subsequent measurement value of the one or more measurement values reaches the second predetermined value, the second predetermined value being different from the first predetermined value; and when the count of clock cycles is lower than a predetermined threshold count, cause a control entity to take mitigation action.

The mitigation action may include at least one of: causing the clock distribution network to decrease a frequency of the clock signal; and/or causing the clock distribution network to pause the clock signal.

BRIEF DESCRIPTION OF DRAWINGS

Embodiments will now be described by way of example only and with reference to the accompanying drawings, in which:

FIG. 1 is a method diagram showing the steps of a method for droop detection;

DETAILED DESCRIPTION

Figure 2:
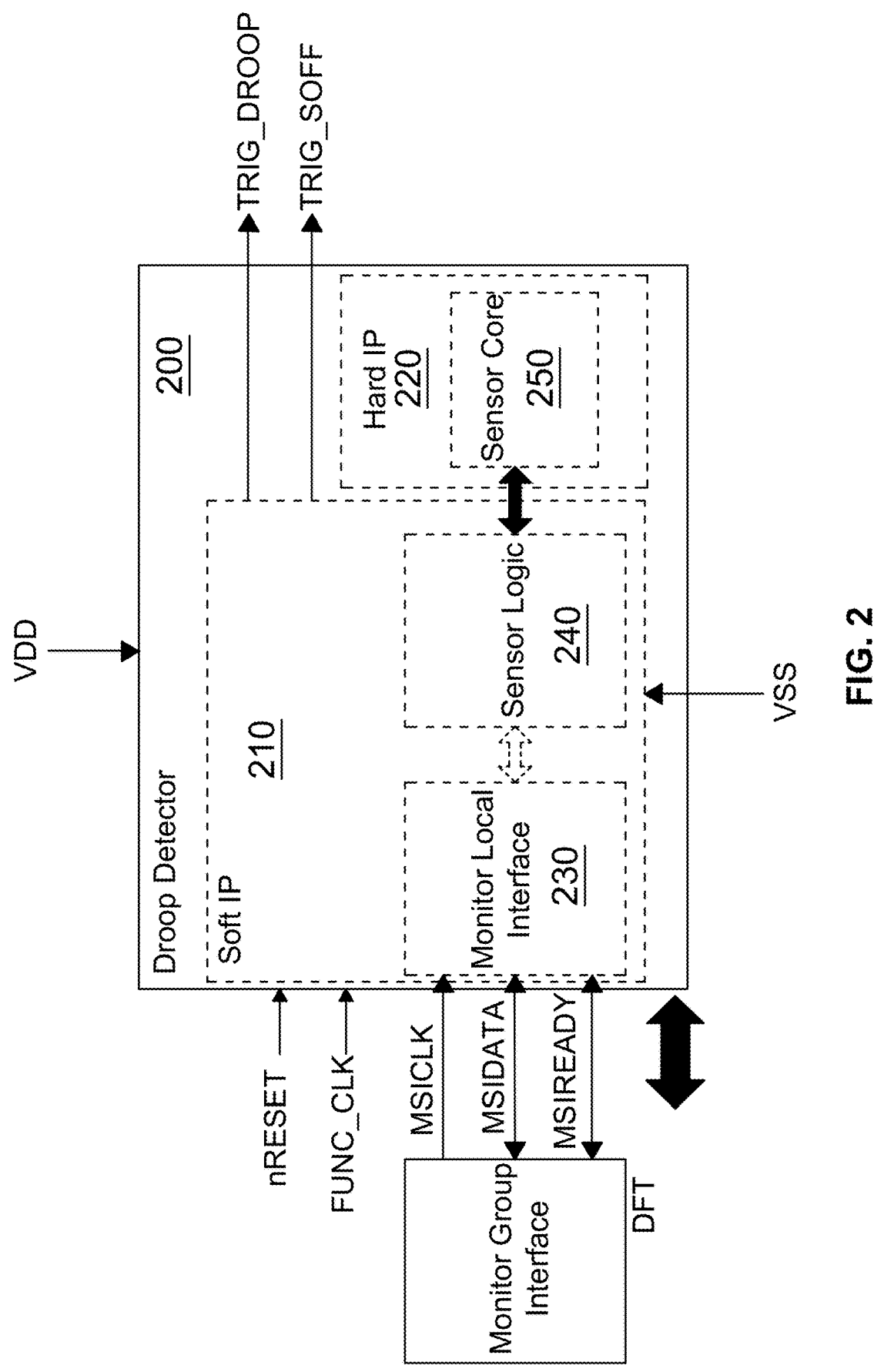
FIG. 2 is a top-level diagram of an example droop detector circuitry.

The complexity of advanced CPUs, GPUs and other processing circuitry is increasing as this circuitry is developed to deliver the extremely high single-thread performance required for multiple applications. On the other hand, power efficiency to ensure operation within the thermal budget is also a growing concern, especially for high-end mobile SoCs, infrastructure and compute sub-systems for automotive applications. Consequently, the maximum current drawn from power delivery networks (PDN) by such systems is increasing rapidly.

Transients in the drawn current are becoming an ever more significant design constraint for processing circuitry. These transients are generated either due to a sudden activity change for a given processing circuit or when the current load changes at the resonance frequency of the power delivery network (PDN) impedance. In such cases, the voltage at a given point in the circuitry (e.g. a transistor junction) suffers a temporary drop in magnitude, hereinafter referred to as a "droop event". Droop can be problematic for the processing circuitry of computers and other electronic devices, and their component sub-systems, as it may lead to instability and data loss.

Droop events differ in severity. A voltage at the transistor junction may reach a threshold voltage at which a droop event may be inferred without reaching a lower "sign-off" threshold, where timing violations are exhibited. More severe droop events that exhibit timing violations are termed, hereafter, "critical droop events", whereas those that exhibit no timing violations are termed, hereafter, "benign droop events".

Processing circuitry typically functions most efficiently when electrical power provided by a power source, such as a power distribution network, PDN, is maintained at a substantially constant voltage. Many computer systems employ voltage regulators to maintain stable voltage levels.

Power delivery networks typically incorporate a range of components, such as capacitors, resistors and inductive elements, that give rise to impedance and transient droop events may arise when the current load changes at resonance frequency of the power delivery network impedance.

Transient droop events may also arise as a result of a sudden activity changes in the processing circuitry.

It is beneficial to detect when the voltage at a transistor junction in a processing circuit suffers a droop event, whether that is due to sudden activity changes or resonances in the PDN. Droop detection facilitates the performance of mitigation action.

Mitigation actions to reduce the impact of droop events on system performance include lowering the frequency of a clock signal supplied to the processing circuitry (or a sub-system thereof) when the droop is detected and/or pausing the clock signal for the duration of the event.

Providing a lower frequency clock signal, or clock stretching, around droop events provides the necessary cushion to the timing margins at lower voltages (i.e. during the droop event). Hence, the circuitry (or sub-system thereof) can operate mostly on the high frequency, while falling back to a lower frequency only when it is needed.

One other benefit of lowering the clock signal frequency is that this reduces the rate of change of current drawn (i.e. di/dt, as the dt increases). Hence, the minimum voltage observed by transistors in the circuitry is also increased.

In benign droop events, then, the application of a fall-back clock signal (at a lower frequency) is sufficient to ensure correct execution of the circuit functionalities: set-up timing failures may be addressed by frequency reduction in such cases.

However, in critical droop events (also referred to as "sign-off events"), the application of a fall-back clock frequency is not sufficient to ensure correct execution of the circuit function, i.e. timing violations are exhibited. This can be the result of a rare, deep droop event, brown-out from the power-source or it may be the response programmed when the circuit's nominal operation point is already at the lower voltage bound, where droop includes the risk of hold-timing failures (in contrast to the set-up timing failures that may be addressed by frequency reduction). One response to a sign-off event is to hold the clock and rely on static data retention in within the circuitry until the event has passed.

Droop detector circuitry is therefore provided in order to detect droop events.

FIG. 1 is a method diagram showing the steps of a method 100 for droop detection. In particular, the method 100 is a method implemented in circuitry that discriminates between critical droop events and benign droop events.

At step 110, a clock signal is received from a clock distribution network.

The circuitry then obtains a first predetermined value, a second predetermined value and a predetermined threshold count from storage, step 120. This storage may include one or more programmable registers in the circuitry itself. These predetermined levels may be programmable and may be set empirically.

At step 130, one or more measurement values associated with a system voltage are obtained. At least one of the one or more measurement values may be a "score" that the circuitry can use to represent the system voltage at a particular location within the circuitry (e.g. process lot point) when operating at a given temperature.

By comparing a first measurement value of the one or more measurement values to the obtained first predetermined value, it is determined whether the first measurement value has reached the first predetermined value. When the first measurement value reaches the first predetermined value, a count of clock cycles is initiated (step 140). The count continues until a subsequent measurement value of the one or more measurement values reaches the second predetermined value: the count is thus effectively the time taken for the measurement value to change from first to second predetermined value. In this way, the "slope" of the change in the "score" can be monitored. The second predetermined value is different from the first predetermined value and, in cases of monitoring a dropping voltage (i.e. the onset of a droop event), the second predetermined value is less than the first predetermined value.

By comparing the resulting count of clock cycles to the obtained, predetermined threshold count, it is determined whether the count of clock cycles is lower than the predetermined threshold count. When the count of clock cycles is lower than the predetermined threshold count, a control entity is caused to take mitigation action, step 150.

The predetermined threshold count may therefore be used to define the boundary between a benign droop event (where the slope is shallower, because the count is higher than the threshold) and a critical droop event (where the slope is steeper, because the count is lower than the threshold).

FIG. 2 illustrates the architecture of a droop detector circuitry 200 (also referred to as "droop detector") that is configured to detect the onset of a droop event and to signal the need for a mitigation action (e.g. a trigger event to cause the clock frequency to be lowered). Such an architecture may be used to implement the circuitry of FIG. 1.

The droop detector 200 has two major parts: soft IP 210 and hard IP 220. The soft IP 210 is the combination of a Monitor Local Interface 230 and sensor logic 240. The hard IP 220 includes a sensor core 250. The interface between the soft IP 210 and the hard IP 220 is dependent on the implementation of the hard IP 220.

As shown in FIG. 2, TRIG_DROOP and TRIG_SOFF are direct outputs of the droop detector. TRIG_DROOP is droop detection signal that triggers the mitigation action as discussed with reference to step 150 of FIG. 1. TRIG_SOFF is the trigger that optionally triggers provision of a further droop detection signal to the control entity. The timing of triggering TRIG_DROOP and TRIF_SOFF is discussed with reference to FIG. 6. TRIG_DROOP and TRIG_SOFF are both synchronised with the rising edge of input FUNC_CLK, which is the clock cycle received from the clock distribution network in the first step of the method 100 described with reference to FIG. 1.

Figure 3:
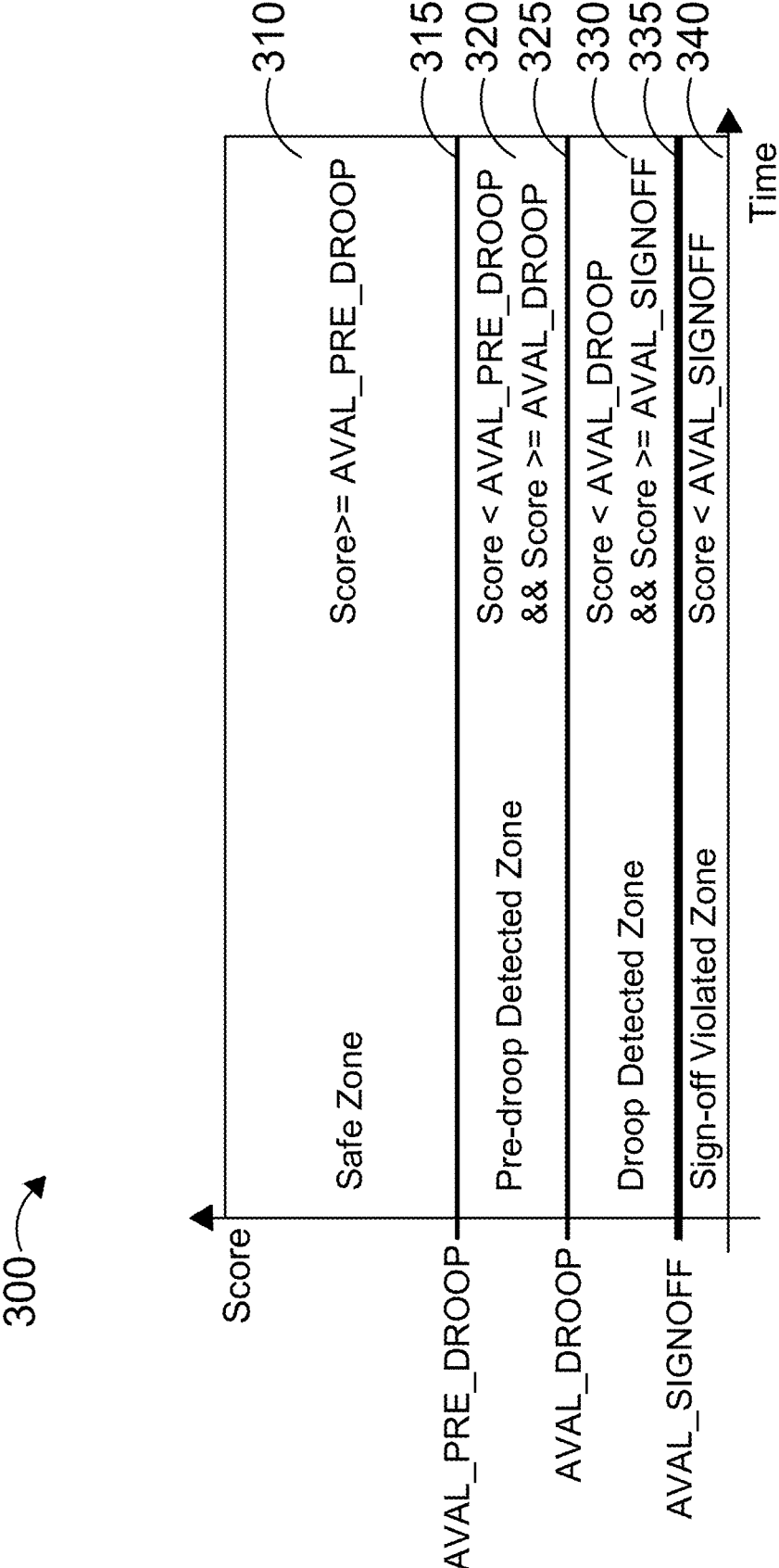
FIG. 3 is a graph depicting the four zones into which a score may be characterised.

FIG. 3 is a graph 300 depicting the four zones into which the score may be characterised, wherein the x-axis indicates time and the y-axis indicates score. The score corresponds to a count of a number of gate stages (e.g. fine gate stages) traversed in a delay line during a clock cycle. The score represents the voltage for a given process lot point and given temperature. The four zones are a safe zone 310, a pre-droop detected zone 320, a droop detected zone 330, and a sign-off violated zone 340.

The safe zone 310 and the pre-droop detected zone 320 are separated by the AVAL_PRE_DROOP threshold 315, which is an example of the first predetermined value described with reference to the aspects of the present disclosure. Accordingly, the safe zone 310 includes all plot points having a score greater than or equal to the value of the AVAL_PRE_DROOP threshold 315.

The pre-droop detected zone 320 and the droop detected zone 330 are separated by the AVAL_DROOP threshold 325, which is an example of the second predetermined value described with reference to the aspects of the present disclosure. Accordingly, the pre-droop detected zone 320 includes all plot points having a score less than the value of the AVAL_PRE_DROOP threshold 315 but greater than or equal to the value of the AVAL_DROOP threshold 325.

The droop detected zone 330 and the sign-off violated zone 340 are separated by the AVAL_SIGNOFF threshold 335, which is a threshold below which sign-off (i.e. timing) violations and/or data loss is expected. Accordingly, the droop detected zone 330 includes all plot points having a score less than the value of the AVAL_DROOP threshold 325 but greater than or equal to the value of the AVAL_SIGNOFF threshold 335.

It follows, therefore, that the sign-off violated zone 340 includes all plot points having a score less than the value of the AVAL_SIGNOFF threshold 335.

In accordance with an aspect of the present disclosure, the droop detector circuitry identifies a droop event based on the score and then classifies the severity of the droop event based on a measured change in score within a predetermined time from the time the droop event is initially identified, this change in score may be termed the "slope" of the droop event.

Figure 4:
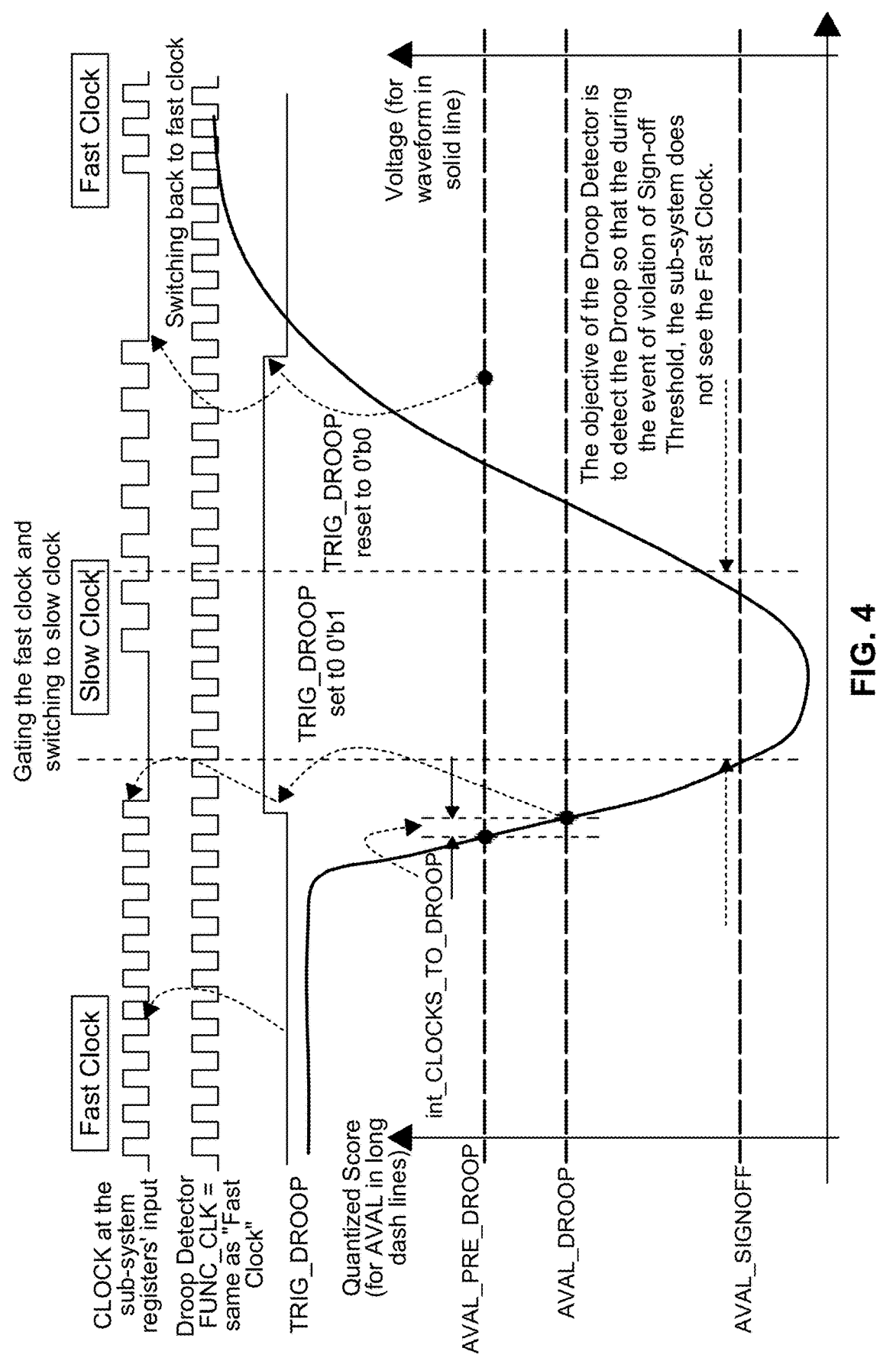
FIG. 4 illustrates a droop event and a corresponding mitigation action.

Handling of a critical droop event is illustrated in FIG. 4. The "score" over time for an example droop event is plotted over the graph 300 illustrated in FIG. 3.

Here, the droop event is identified as such when the measurement value (i.e. score) reaches a pre-droop threshold (AVAL_PRE_DROOP in the FIG. 4).

If the score is in the pre-droop detected zone, the droop detector (for instance, the circuitry of FIG. 2) starts to count the number of clock cycles before the score goes below AVAL_DROOP in the droop detected zone. This is referred to as the "slope" of the droop. It is captured in an internal register called int_CLOCKS_TO_DROOP.

The value of int_CLOCKS_TO_DROOP is compared against a threshold count value, corresponding to a slope of droop (say, AVAL_CLOCKS_TO_DROOP) at which the droop is expected to continue to a minimum below a sign-off violation level (e.g. AVAL_SIGNOFF). The value of this register will be higher (corresponding to a shallower drop in voltage) for a benign droop as compared to a critical droop. Thus, if int_CLOCKS_TO_DROOP>AVAL_CLOCKS_TO_ DROOP, then a slow droop event, or benign droop, is inferred. If int_CLOCKS_TO_DROOP<= AVAL_CLOCKS_TO_DROOP, a steep droop event, or critical droop, is inferred. The latter case is illustrated in FIG. 4.

To obtain the measurement value, a value corresponding to the supply voltage, Vdd, at a point in the processing circuitry is monitored over time. Certain embodiments are configured to detect the onset of droop events sufficiently rapidly that mitigation action may be taken, i.e. before sign-off violation level (e.g. AVAL_SIGNOFF) is reached. Where the voltage begins to drop, the droop detector infers that a droop event is imminent and triggers a mitigation action. The inference of a droop event may be drawn at the time the supply voltage reaches a threshold voltage and before the voltage drops to a level (e.g. AVAL_SIGNOFF) that may cause instability or data loss.

If the droop detector detects the critical droop and mitigation action is performed (e.g. the clock frequency is lowered), the setup timing can be met.

In certain embodiments, the supply voltage is not measured directly. Instead, as shown in FIGS. 3 to 6, a measurement value that corresponds to the supply voltage is determined using a delay line to determine the extent to which signals are delayed as they traverse a set of gates in each FUNC_CLK cycle. This measurement value may be termed a "score" and may correspond to the number of delay line gates traversed in a given CLK cycle period. As such, the score represents the voltage for a given process lot point and given temperature). The reader will appreciate that other measurement values may be used as proxies for the voltage without departing from the principles described herein.

Figure 5:
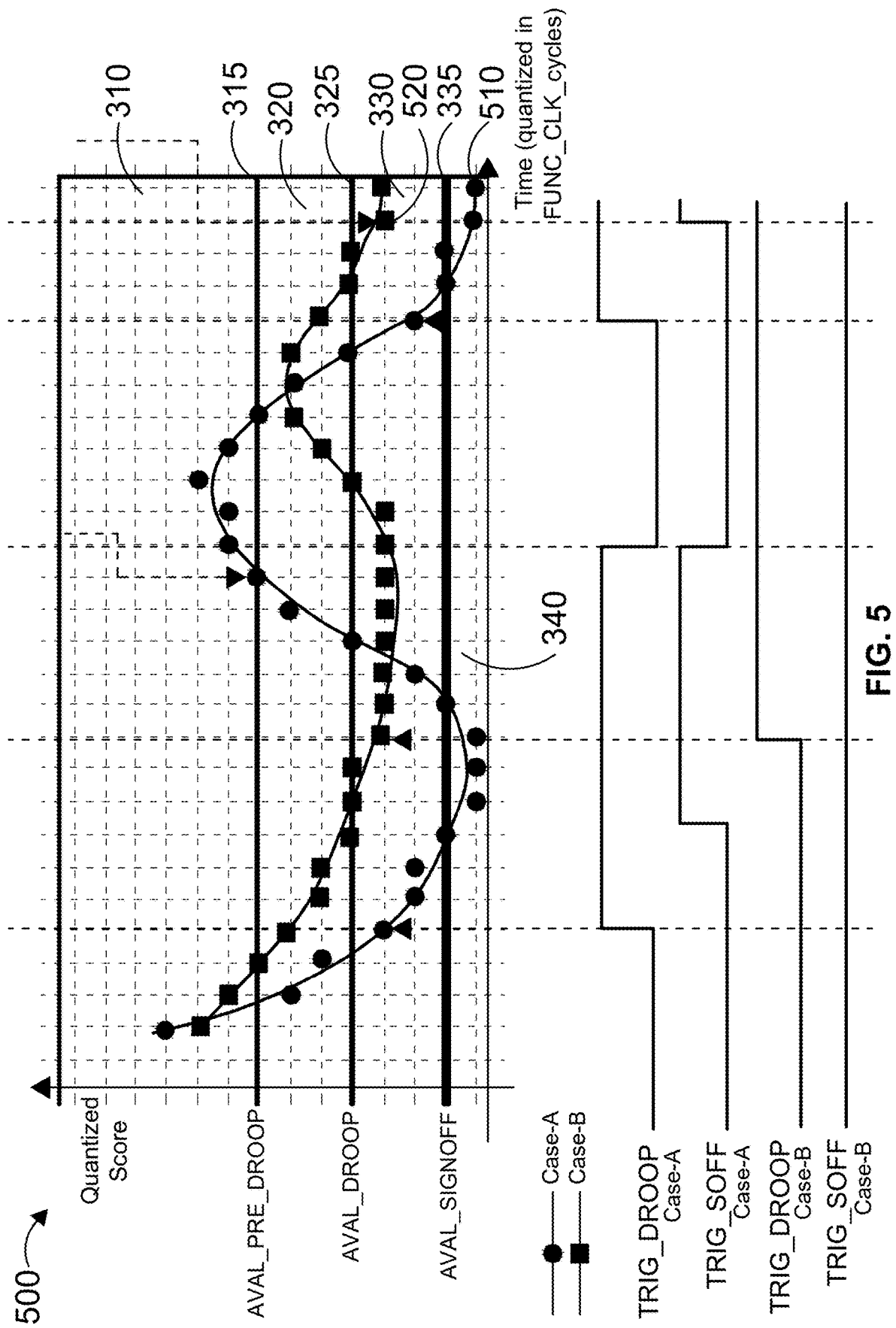
FIG. 5 is a graph depicting the score over time of two example cases with droop events having differing slopes.

FIG. 5 is a graph 500 depicting the score over time of two example cases, a first case 510 and a second case 520. The time axis is quantized in FUNC_CLK cycles, such that each vertical grid line corresponds to a single FUNC_CLK cycle. It can be seen that the score for each case 510, 520 is measured during each FUNC_CLK cycle. The circuitry includes the necessary storage or memory to store the necessary number of scores over time for a voltage droop to be identified. FIG. 5 also depicts the signal waveforms corresponding to TRIG_DROOP and TRIG_SOFF for the first case (Case-A) and second case (Case-B).

The differentiation between a benign droop and a critical droop event, previously discussed, is further illustrated in FIG. 5. The second case 520 is an example of a shallow event in this case the droop event will never cross the sign-off threshold also known as the benign droop event. Similarly, the first case 510 is an example of a steep or critical droop event, similar to the event depicted in FIG. 4.

The first case 510 includes a drop in score from the safe zone 310, beyond the AVAL_PRE_DROOP threshold 315, into the pre-droop detected zone 320, at which point a count of clock cycles is started. The first case 510 subsequently includes a drop in score from the pre-droop detected zone 320, beyond the AVAL_DROOP threshold 325, into the droop detected zone 330, when the count of clock cycles is completed. Where, as in the first case 510, the count is determined to be below a predetermined count threshold value (i.e. the droop event is deemed to be a critical droop), a critical droop signal detection signal is output as a result and this output is used to trigger the performance of one or more mitigation actions. Thus, the score passing the AVAL_DROOP threshold 325 coincides with a conditional signalling that mitigation action is to be performed.

The first case 510 subsequently includes a continued drop in score from the droop detected zone 330, beyond the AVAL_SIGNOFF threshold 335, into the sign-off violated zone 340. As the score fell into the sign-off violated zone 340, mitigation action would be needed.

The score passing the AVAL_SIGNOFF threshold 335 may trigger the sending of a further droop detection signal. The score increases before decreasing again. The passing of the score from the safe zone 310 into the sign-off violated zone 340 occurs twice in the first case 510. The first case 510, then, illustrates two critical drop events of the type illustrated in FIG. 4.

The second case 520 includes a drop in score from the safe zone 310, beyond the AVAL_PRE_DROOP threshold 315, into the pre-droop detected zone 320. The second case 520 subsequently includes a drop in score from the pre-droop detected zone 320, beyond the AVAL_DROOP threshold 325, into the droop detected zone 330. Again, reaching the AVAL_PRE_DROOP threshold 315 triggers the initiation of a count, while subsequently reaching the AVAL_DROOP threshold 325 completes the count. In the second case 520, however, the comparison of the count to the predetermined count threshold value, indicates that mitigation action is not needed (i.e. the droop event is deemed to be a benign droop). Nevertheless, the score passing the AVAL_DROOP threshold 325 may triggers the sending of a signal indicating that the droop event is benign.

The second case 520 subsequently includes an increase in score into the pre-droop detected zone 320, such that the score does not meet the AVAL_SIGNOFF threshold 335 or enter into the sign-off violated zone 340. The score is not shown to reach the safe zone 310 before again decreasing.

A drop in score into the droop detected zone 330 may be considered to be a first order droop event, which is the highest resonance frequency of the Power Delivery Network (PDN). The circuitry provides protection against a more severe first order droop event (i.e. a critical droop event) by causing mitigation action to be taken in response to the signal, for example by decreasing the frequency of the clock signal by the clock distribution network.

In certain embodiments, a drop in score into the sign-off violated zone 340 may be considered to be a higher order droop event, such as a second or third order droop event. The circuitry may provide protection against a higher order droop event by causing action to be taken (for example by pausing the clock) in response to further droop detection signals that are output when the AVAL_SIGNOFF threshold 335 is reached.

It can be seen in FIG. 5 that both the first case 510 and the second case 520 include a drop in score from the safe zone 310, past the AVAL_PRE_DROOP 315 threshold and into the pre-droop detected zone 320, and then past the AVAL_DROOP threshold 325 and into the droop detected zone 330. The first case 510 and the second case 520 both include drops in score, followed by increases in score, then followed by a further drop in score.

In the first case 510, the increase in score is sufficient to bring the score back above the AVAL_PRE_DROOP threshold 315 and into the safe zone 310. Once the score re-enters the safe zone 310, the voltage droop is considered to have concluded. The subsequent drop in score into the droop detected zone 330 is considered to be a second voltage droop event.

However, in the second case 520, the increase in score is not sufficient to bring the score back above the AVAL_PRE_DROOP threshold 315 and into the safe zone 310. Accordingly, the subsequent drop in score into the droop detected zone 330 is considered to be a continuation of the first voltage droop event.

In the first case 510, a droop event counter may be incremented to show two droop events. However, in the second case 520, a droop event counter may be incremented to show only one droop event.

In embodiments of the present disclosure, then, the droop detector performs checks related to the slope of the droop events to differentiate between the benign droop event and the critical droop event.

In certain embodiments, the value of the predetermined count threshold (i.e. AVAL_CLOCKS_TO_DROOP) is programmable post silicon. The droop detector may have a dedicated Slope Calibration that can be used to calibrate the threshold value of slope of droop in order to differentiate a benign droop from a critical droop based on empirical data for voltage droop events.

In certain embodiments the internal register, int_CLOCKS_TO_DROOP, where the count of clock cycles is maintained, is a 4-bit internal register to capture the slope of droop.

In certain embodiments, the droop detector has the capability of measuring the slope of the droop events and, based on these measurements, critical droop events that cause the timing violations can be more accurately identified.

This increases the efficiency because benign droop events which enter the droop detected zone which were previously causing a trigger event can be avoided. Based on the slow slope of these benign droop events it can be predicated that these events will not reach the sign-off Threshold. Hence, the benign droop events which would have caused a trigger prematurely in the previous implementation can thus be avoided. It improves the performance of the system by not slowing down the clock frequency in case of benign droop events.

Figure 6:
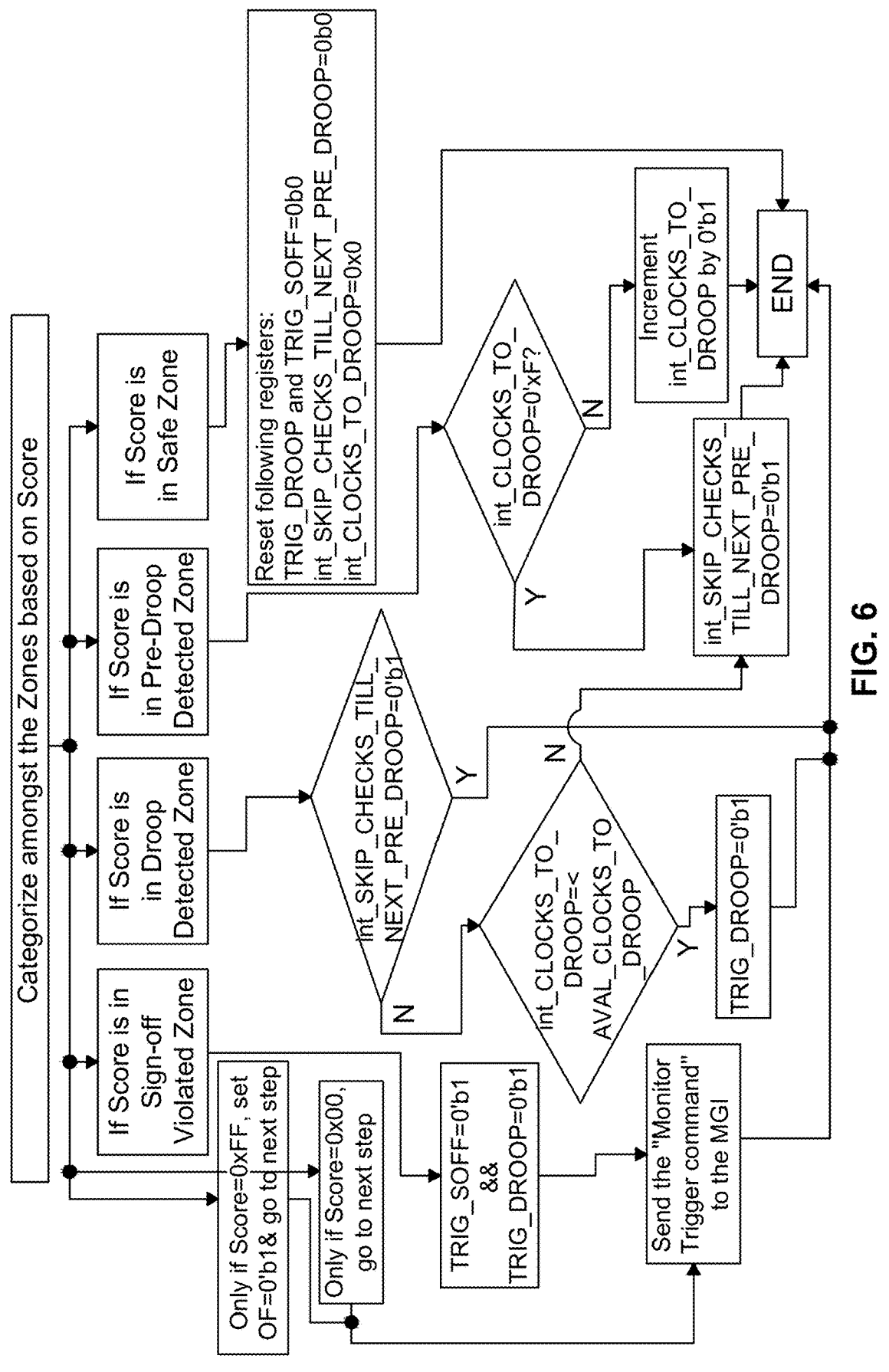
FIG. 6 is a trigger management flow diagram describing the course of action taken during each clock cycle for managing triggers.

FIG. 6 is a trigger management flow diagram describing the course of action taken during each clock cycle for managing triggers. The flow begins by calculating a score in the respective clock cycle and determining if the score is in the safe zone, the pre-droop detected zone, the droop detected zone, or the sign-off violated zone. The circuitry for implementing the operations in the flow diagram may include four registers, namely a TRIG_DROOP register, a TRIG_SOFF register, an int_SKIP_CHECKS_ TILL_NEXT_PRE_DROOP register and an int_CLOCK- S_TO_DROOP register.

If the score is in the safe zone, each of the four registers are reset and the flow ends.

If the score is in the pre-droop detected zone, a state of the int_CLOCKS_TO_DROOP register is interrogated. If the int_CLOCKS_TO_DROOP register does not meet a 0'xF condition, the int_CLOCKS_TO_DROOP register is incremented by 1'b1 and the flow ends. If the int_CLOCK- S_TO_DROOP register does meet a 0xF condition, the int_SKIP_CHECKS_TILL_NEXT_PRE_DROOP register is set to 1'b1 and the flow ends.

If the score is in the droop detected zone, the int_ SKIP_CHECKS_TILL_NEXT_PRE_DROOP register is interrogated. If the int_SKIP_CHECKS_TILL_ NEXT_PRE_DROOP register is set at 1'b1, the flow ends. If the int_SKIP_CHECKS_TILL_NEXT_PRE_DROOP register is not set at 1'b1, the level of the int_CLOCK- S_TO_DROOP is compared to the level of AVAL_CLOCK- S_TO_DROOP. If int_CLOCKS_TO_DROOP is not less than or equal to AVAL_CLOCKS_TO_DROOP, the int_SKIP_CHECKS_TILL_NEXT_PRE_DROOP register is set to 1'b1 and the flow ends. If int_CLOCK- S_TO_DROOP is less than or equal to AVAL_CLOCK- S_TO_DROOP, the TRIG_DROOP is set to 1'b1, thereby causing a first mitigation action, and the flow ends.

If the score is in the sign-off violated zone, TRIG_SOFF and TRIG_DROOP are set to 1'b1, meaning both the first and second mitigation actions are caused, the monitor trigger command is sent to the MGI, and the flow ends.

Figure 7:
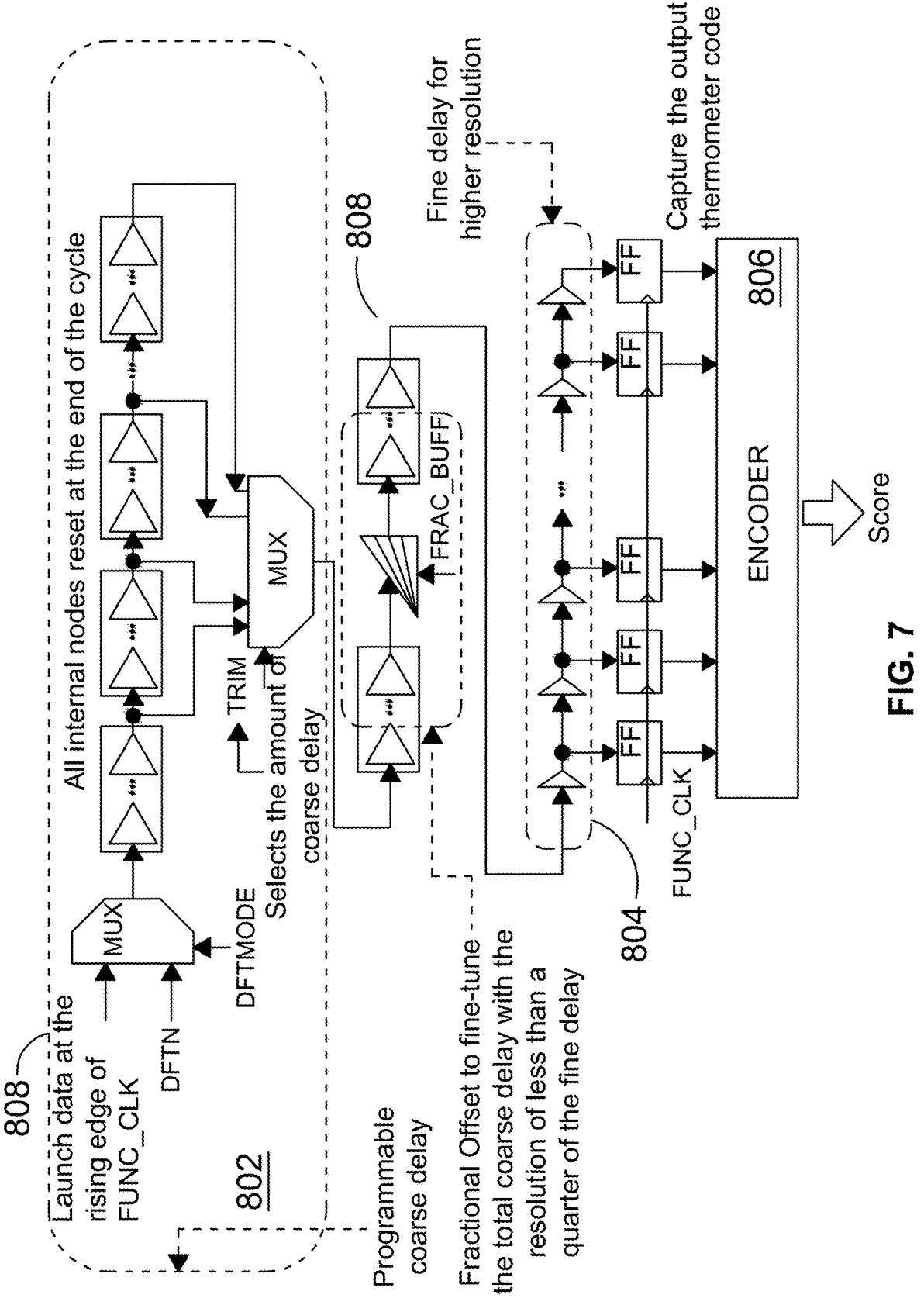
FIG. 7 illustratively shows an example of a delay monitor having a delay line.

An example of a delay monitor 808 having a delay line which may be used in accordance with the present techniques is illustratively shown in FIG. 7.

The delay monitor 808 comprises a coarse delay line 802, a fine delay line 804 and an encoder 806. The delay monitor optionally comprises a fractional offset 808 between coarse delay and the fine delay.

The measurement value or score is provided by the output of the encoder. The measurement value or score corresponds to a count of the number of fine gate stages traversed in the fine delay line 804 during a predetermined number of clock cycles. The output may be measured every output clock cycle of a clock distribution network and averaged over a predetermined number of clock cycles for analysis.

It will be appreciated that the delay line 804 is only provided as an example of method to provide the measurement value.

Figure 8:
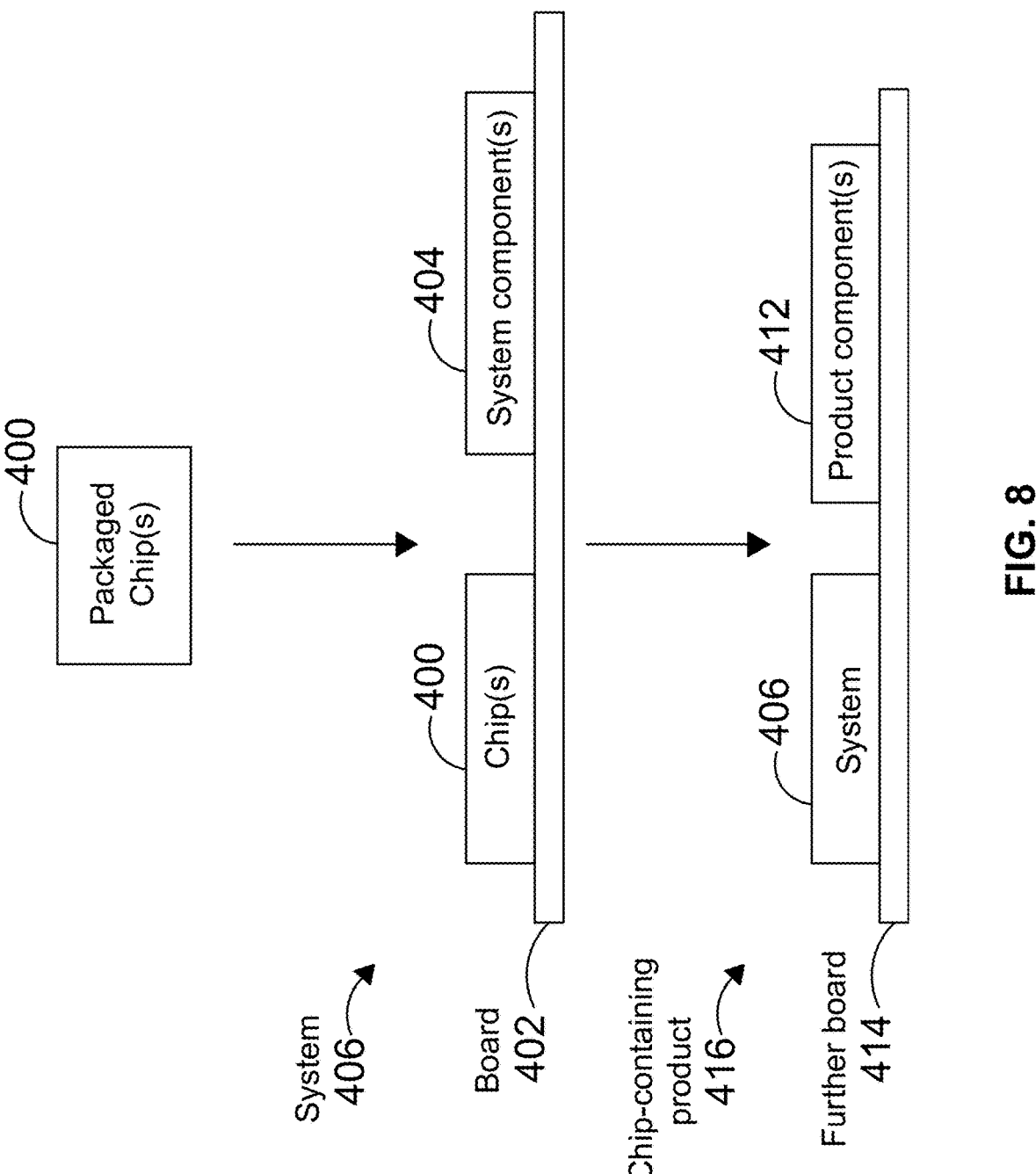
FIG. 8 illustrates a system and a chip-containing product.

As shown in FIG. 8, one or more packaged chips 400, with the circuitry described above implemented on one chip or distributed over two or more of the chips, are manufactured by a semiconductor chip manufacturer. In some examples, the chip product 400 made by the semiconductor chip manufacturer may be provided as a semiconductor package which comprises a protective casing (e.g. made of metal, plastic, glass or ceramic) containing the semiconductor devices implementing the circuitry described above and connectors, such as lands, balls or pins, for connecting the semiconductor devices to an external environment. Where more than one chip 400 is provided, these could be provided as separate integrated circuits (provided as separate packages), or could be packaged by the semiconductor provider into a multi-chip semiconductor package (e.g. using an interposer, or by using three-dimensional integration to provide a multi-layer chip product comprising two or more vertically stacked integrated circuit layers).

In some examples, a collection of chiplets (i.e. small modular chips with particular functionality) may itself be referred to as a chip. A chiplet may be packaged individually in a semiconductor package and/or together with other chiplets into a multi-chiplet semiconductor package (e.g. using an interposer, or by using three-dimensional integration to provide a multi-layer chiplet product comprising two or more vertically stacked integrated circuit layers).

The one or more packaged chips 400 are assembled on a board 402 together with at least one system component 404 to provide a system 406. For example, the board may comprise a printed circuit board. The board substrate may be made of any of a variety of materials, e.g. plastic, glass, ceramic, or a flexible substrate material such as paper, plastic or textile material. The at least one system component 404 comprise one or more external components which are not part of the one or more packaged chip(s) 400. For example, the at least one system component 404 could include, for example, any one or more of the following: another packaged chip (e.g. provided by a different manufacturer or produced on a different process node), an interface module, a resistor, a capacitor, an inductor, a transformer, a diode, a transistor and/or a sensor.

A chip-containing product 416 is manufactured comprising the system 406 (including the board 402, the one or more chips 400 and the at least one system component 404) and one or more product components 412. The product components 412 comprise one or more further components which are not part of the system 406. As a non-exhaustive list of examples, the one or more product components 412 could include a user input/output device such as a keypad, touch screen, microphone, loudspeaker, display screen, haptic device, etc.; a wireless communication transmitter/receiver; a sensor; an actuator for actuating mechanical motion; a thermal control device; a further packaged chip; an interface module; a resistor; a capacitor; an inductor; a transformer; a diode; and/or a transistor. The system 406 and one or more product components 412 may be assembled on to a further board 414.

The board 402 or the further board 414 may be provided on or within a device housing or other structural support (e.g. a frame or blade) to provide a product which can be handled by a user and/or is intended for operational use by a person or company.

The system 406 or the chip-containing product 416 may be at least one of: an end-user product, a machine, a medical device, a computing or telecommunications infrastructure product, or an automation control system. For example, as a non-exhaustive list of examples, the chip-containing product could be any of the following: a telecommunications device, a mobile phone, a tablet, a laptop, a computer, a server (e.g. a rack server or blade server), an infrastructure device, networking equipment, a vehicle or other automotive product, industrial machinery, consumer device, smart card, credit card, smart glasses, avionics device, robotics device, camera, television, smart television, DVD players, set top box, wearable device, domestic appliance, smart meter, medical device, heating/lighting control device, sensor, and/ or a control system for controlling public infrastructure equipment such as smart motorway or traffic lights.

As will be appreciated by one skilled in the art, the present technology may be embodied as a method, a circuit or a computer readable medium comprising data and imperatives to cause construction of a circuit. Accordingly, the present techniques may take the form of an entirely hardware embodiment, an entirely software embodiment, or an embodiment combining software and hardware. Where the word "component" is used, it will be understood by one of ordinary skill in the art to refer to any portion of any of the above embodiments.

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the present techniques. Alternatively or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the present techniques. Alternatively or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

In the present application, lists of features preceded with the phrase "at least one of" mean that any one or more of those features can be provided either individually or in combination. For example, "at least one of: [A], [B] and [C]" encompasses any of the following options: A alone (without B or C), B alone (without A or C), C alone (without A or B), A and B in combination (without C), A and C in combination (without B), B and C in combination (without A), or A, B and C in combination.

Although illustrative embodiments of the present techniques have been described in detail herein with reference to the accompanying drawings, it is to be understood that the present techniques are not limited to those precise embodiments, and that various changes and modifications can be effected therein by one skilled in the art without departing from the scope of the present techniques as defined by the appended claims.

The invention claimed is:

1. Circuitry for detecting a voltage droop event, the circuitry configured to:
   receive a clock signal from a clock distribution network;
   obtain, from a storage, a first predetermined value, a second predetermined value and a predetermined threshold count;
   obtain one or more measurement values associated with a system voltage;
   when a first measurement value of the one or more measurement values reaches the first predetermined value, initiate a count of clock cycles until a subsequent measurement value of the one or more measurement values reaches the second predetermined value, the second predetermined value being different from the first predetermined value; and
   when the count of clock cycles is lower than the predetermined threshold count, cause a control entity to take mitigation action.

2. The circuitry of claim 1, wherein the measurement value is positively correlated with the system voltage, the measurement value reaching the first predetermined value when the measurement value is less than or equal to the first predetermined value.

3. The circuitry of claim 1, wherein the measurement value comprises a score, the score corresponding to a count of a number of fine gate stages traversed in a delay line during a predetermined number of clock cycles.

4. The circuitry of claim 3, wherein the predetermined number of clock cycles is one clock cycle.

5. The circuitry of claim 1, wherein the count corresponds to the slope of the droop event.

6. The circuitry of claim 1, wherein the mitigation action comprises causing the clock distribution network to decrease a frequency of the clock signal.

7. The circuitry of claim 1, wherein the mitigation action is selected from a plurality of actions based on the count.

8. The circuitry of claim 1, further configured to:

obtain, from the storage, a third predetermined value;

provide a droop detection signal to the clock distribution network in response to the measurement value reaching the third predetermined value, the third predetermined value being different from the second predetermined value; and cause the control entity to take a second mitigation action in response to the droop detection signal.

9. The circuitry of claim 1, the circuitry being configured to implement a state machine.

10. The circuitry of claim 9, the circuitry being configured to:

when a subsequent measurement value of the one or more measurement values reaches the first predetermined value after having caused the control entity to take mitigation action, resetting a register storing the count of clock cycles.

11. A system comprising:

the circuitry of claim 1, implemented in at least one packaged chip;

at least one system component; and a board, wherein the at least one packaged chip and the at least one system component are assembled on the board.

12. A chip-containing product comprising the system of claim 11 assembled on a further board with at least one other product component.

13. A non-transitory computer-readable medium to store computer-readable code for fabrication of the circuitry for detecting a voltage droop event of claim 1.

14. A method comprising:

receiving a clock signal from a clock distribution network;

obtaining, from a storage, a first predetermined value, a second predetermined value and a predetermined threshold count;

obtaining one or more measurement values associated with a system voltage;

when a first measurement value of the one or more measurement values reaches the first predetermined value, initiating a count of clock cycles until a subsequent measurement value of the one or more measurement values reaches the second predetermined value, the second predetermined value being different from the first predetermined value;

when the count of clock cycles is lower than the predetermined threshold count, causing a control entity to take mitigation action.

15. The method of claim 14, wherein the measurement value is positively correlated with the system voltage, the measurement value reaching the first predetermined value when the measurement value is less than or equal to the first predetermined value.

16. The method of claim 14, wherein the measurement value comprises a score, the score corresponding to a count of a number of fine gate stages traversed in a delay line during a predetermined number of clock cycles.

17. The method of claim 14, wherein the count corresponds to the slope of the droop event.

18. The method of claim 14, wherein the mitigation action comprises causing the clock distribution network to decrease a frequency of the clock signal.

19. An apparatus comprising:

circuitry for detecting a voltage droop event;

a power delivery network configured to provide power to the circuitry at a system voltage; and a clock distribution network configured to provide a clock signal to the circuitry; and wherein the circuitry is configured to:

obtain, from a storage, a first predetermined value, a second predetermined value and a predetermined threshold count;

obtain one or more measurement values associated with a voltage provided by the power delivery network;

when a first measurement value of the one or more measurement values reaches the first predetermined value, initiate a count of clock cycles until a subsequent measurement value of the one or more measurement values reaches the second predetermined value, the second predetermined value being different from the first predetermined value; and when the count of clock cycles is lower than the predetermined threshold count, cause a control entity to take mitigation action.

20. The apparatus of claim 19, wherein mitigation action includes at least one of:

causing the clock distribution network to decrease a frequency of the clock signal; and/or causing the clock distribution network to pause the clock signal.

* * * * *